(12) United States Patent
Muramatsu et al.

(10) Patent No.: US 6,597,056 B1
(45) Date of Patent: Jul. 22, 2003

(54) LAMINATED CHIP COMPONENT AND MANUFACTURING METHOD

(75) Inventors: Nobuaki Muramatsu, Tamagawa-Mura (JP); Takahiro Ogawa, Tamagawa-Mura (JP)

(73) Assignee: Toko Kabushiki Kaisha, Tokyo-To (JP)

( * ) Notice: Subject to any disclaimer, the term of this patent is extended or adjusted under 35 U.S.C. 154(b) by 0 days.

(21) Appl. No.: 09/668,740

(22) Filed: Sep. 25, 2000

(30) Foreign Application Priority Data

Sep. 24, 1999 (JP) .......................... 11-269856

(51) Int. Cl.[7] ............................... H01L 29/00
(52) U.S. Cl. .................. 257/531; 361/763; 361/821; 257/691; 257/670
(58) Field of Search ................ 257/326, 382, 257/383, 531, 670, 691, 785; 336/73; 333/202; 361/306.3, 763, 766, 821

(56) References Cited

U.S. PATENT DOCUMENTS 6,356,181 B1 * 3/2002 Kitamura .................. 336/200

2001/0041401 A1 * 11/2001 Ahn et al. ................. 138/145

* cited by examiner

*Primary Examiner*—Nathan J. Flynn
*Assistant Examiner*—Leonardo Andújar
(74) *Attorney, Agent, or Firm*—Pillsbury Winthrop LLP

(57) ABSTRACT

A laminated chip component including: alternately laminated conductive patterns (13,43,63) and insulating sheets (11,41,61); through-holes (12,42,62) which are provided in the insulating sheets and connect top layer conductive patterns to bottom layer conductive patterns; auxiliary conductive patterns (15,45,65) which are provided on the top faces of the conductive patterns at positions facing the through-holes provided in adjacent insulating sheets; and conductors (14,64) which are provided in the through-holes. The auxiliary conductive patterns can be substituted by conductor sections (16,66) which are provided in the insulating sheets at the positions facing the through-holes provided in adjacent insulating sheets. And, a method for manufacturing a laminated chip component is also disclosed.

8 Claims, 5 Drawing Sheets

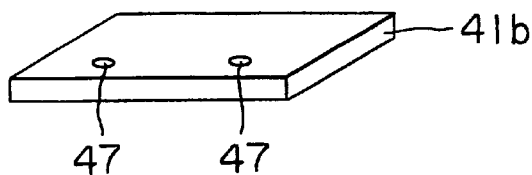
F I G. 5A
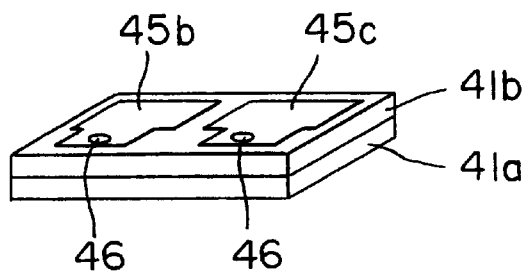
F I G. 5B
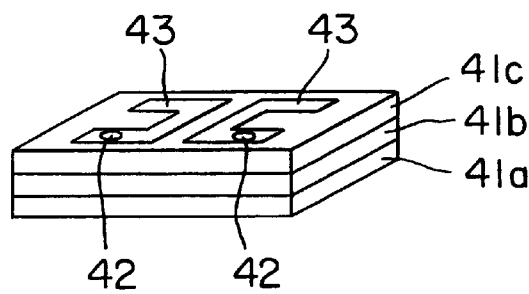
F I G. 5C
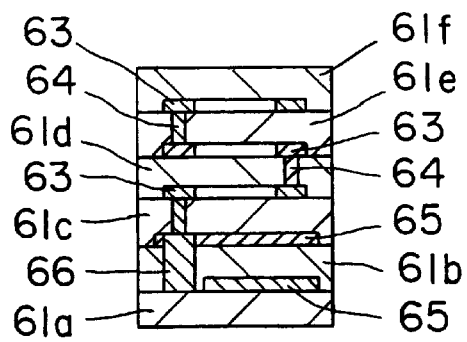
F I G. 6

LAMINATED CHIP COMPONENT AND MANUFACTURING METHOD

BACKGROUND OF THE INVENTION

1. Field of the Invention

The present invention relates to a laminated chip component comprising alternately laminated conductive patterns, and insulating sheets, the conductive patterns between the insulating sheets being connected by conductors in through-holes, and a method for manufacturing the laminated chip component.

2. Description of the Related Art

An inductance element such as that shown in FIG. 7 is a conventional laminated chip component of this type. The inductance element of FIG. 7 comprises conductive patterns 73a, 73b, 73c and 73d which are printed on the top faces of insulating sheets 71a, 71b, 71c and 71d. The insulating sheets 71a, 71b, 71c and 71d are laminated sequentially and covered with protective insulating sheet 71e. As shown in FIG. 8, the upper layer and lower layer conductive patterns 73a, 73b, 73c and 73d are connected together by conductors 74 which are provided in through-holes 72. These conductive patterns form a spiral coil pattern. The conductive patterns 73a and 73d are extracted at the end faces of the laminated body, and connect to terminals which are provided at the end faces of the laminated body.

Another conventional laminated chip component comprises a circuit formed by laminating together passive elements such as coils, capacitors, and the like. FIGS. 9 and 10 show a filter which is formed by laminating two coils and capacitors. An insulating sheet 91a having a conductive pattern for capacitor 95a printed thereon is laminated with an insulating sheet 91b having conductive patterns for capacitor 95b and 95c printed thereon, thereby forming two capacitors. Insulating sheets 91c, 91d and 91e having two conductive patterns for half-turn coil printed thereon and a protective insulating sheet 91f are laminated sequentially on the laminated body which contains the capacitors. The conductive patterns for coil 93a, 93b and 93c are connected by a conductor 94 provided in a through-hole 92. The conductive patterns for coil 93d, 93e and 93f are connected by a conductor 94 provided in a through-hole 92. The conductive patterns for coil form two coils inside the laminated body.

The conductive pattern for coil 93a and the conductive pattern for capacitor 95b are connected by a conductor 94 provided in a through-hole 92. The conductive pattern for coil 93d and the conductive pattern for capacitor 95c are connected by a conductor provided in a through-hole 92.

The conductive pattern for coil 93c and the conductive pattern for coil 93f are extracted at two sides of the laminated body, and connect to terminals. The conductive pattern for capacitor 95a is extracted at the sides where the conductive patterns for coil are not extracted, and connects to terminals.

In conventional laminated chip components such as that shown in FIGS. 7 and 8, the firing shrinkage rate of the conductive patterns is greater than the firing shrinkage rate of the insulating sheets. Consequently, the connection in the through-holes is sometimes broken, as shown by numeral 80 in FIG. 8.

In conventional laminated chip components such as that shown in FIGS. 9 and 10, different materials are generally used for the conductive patterns for coil and the conductive patterns for capacitor. As a result, the two types of conductive patterns have different firing shrinkage rates and different reactivity. Consequently, in conventional laminated chip components such as that shown in FIGS. 9 and 10, not only is the firing shrinkage rate of the conductive patterns greater than the firing shrinkage rate of the insulating sheets, but in addition, the two types of conductive patterns have different firing shrinkage rates and different reactivity. As a consequence, the connection in the through-holes in liable to break, especially between a coil and a capacitor as shown by numeral 100 in FIG. 10.

SUMMARY OF THE INVENTION

It is an object of the present invention to provide a laminated chip component in which broken connections in through-holes of insulating sheets can be prevented.

In order to achieve the abovementioned object, this invention is featured by a laminated chip component including: alternately laminated conductive patterns and insulating sheets; through-holes which are provided in the insulating sheets; auxiliary conductive patterns which are provided on the top faces of positions which facing the through-holes provided in adjacent insulating sheets of the conductive patterns; and conductors which are provided in the through-holes, and connect upper layer conductive patterns to the auxiliary conductive pattern on lower layer conductive patterns.

This invention is also featured by a laminated chip component including: alternately laminated conductive patterns and insulating sheets; through-holes which are provided in the insulating sheets; conductor sections which are provided in the insulating sheets at positions facing the through-holes provided in adjacent insulating sheets; and conductors which are provided in the conductor sections and the through-holes and connect upper layer conductive patterns to lower layer conduction patterns.

This invention is further featured by a laminated chip component including: alternately laminated conductive patterns and insulating sheets; through-holes which are provided in the insulating sheets; said conductive pattern comprising a first conductive pattern and a second conductive pattern of different materials; auxiliary conductive pattern of the same material as said second conductive pattern, provided on the top faces at the connection section which connect to said second conductive pattern of said first conductive pattern; and a conductor of the same material as said second conductive pattern, provided in a through-hole which runs between said first conductive pattern and said second conductive pattern.

This invention is still further featured by a laminated chip component including: alternately laminated conductive patterns and insulating sheets; through-holes which are provided in the insulating sheets; said conductive pattern comprising a first conductive pattern and a second conductive pattern of different materials; the insulating sheet on which said first conductive pattern is provided comprising a conductor section for providing a conductor of the same material as said second a conductive pattern, the conductor section being provided at position which corresponding to the connection between said first and second conductive patterns in said insulating sheet; and conductors comprising the same material as said second conductive pattern, the conductors being provided in a through-hole which runs between said first conductive pattern and said second conductive pattern.

This invention is still further featured by a method for manufacturing a laminated chip component comprising alternately laminated conductive patterns and insulating sheets, through-holes which are provided in said insulating sheets, the method comprising the steps of: printing conductive patterns on said insulating sheets; printing auxiliary conductive patterns on the top faces of said conductive patterns at positions facing said through-holes of adjacent insulating sheets; and connecting an upper layer conductive pattern to said auxiliary conductive pattern on a lower layer conductive pattern by means of conductors which are provided in the through-holes in said insulating sheets.

This invention is still further featured by a method for manufacturing a laminated chip component comprising alternately laminated conductive patterns and insulating sheets, through-holes which are provided in said insulating sheets, the method comprising the steps of: printing a first conductive pattern on an insulating sheet; printing an auxiliary conductive pattern comprising the same material as the second conductive pattern on the top face at the connection section which connects to said second conductive pattern of said first conductive pattern; and connecting the auxiliary conductive pattern on the first conductive pattern to the second conductive pattern by means of a conductor comprising the same material as the second conductive pattern, the conductor being provided in a through-hole in the laminated insulating sheets.

This invention is still further featured by a method for manufacturing a laminated chip component comprising alternately laminated conductive patterns and insulating sheets, through-holes which are provided in said insulating sheets, the method comprising the steps of: providing conductor sections in the insulating sheets at positions facing the through-hole in adjacent insulating sheets; printing conductive patterns on said insulating sheets and providing conductors in said conductor sections; and connecting said upper layer conductive pattern to said auxiliary conductive pattern on said bottom layer conductive pattern by means of conductors which are provided in the through-holes of said insulating sheets.

BRIEF DESCRIPTION OF THE DRAWINGS

FIGS. 5A, 5B and 5C are diagrams showing a manufacturing sequence in the second embodiment of the laminated chip component of this invention;

FIG. 6 is a cross-sectional view of a third embodiment of the laminated chip component of this invention;

DESCRIPTION OF THE PREFERRED EMBODIMENTS

The laminated chip component of the present invention comprises first and second conductive patterns of different materials. The first conductive pattern is formed on multiple first insulating sheets. The multiple first insulating sheets are laminated to obtain a laminated body containing a first element. The second conductive pattern is formed on multiple second insulating sheets. The multiple second insulating sheets are laminated to obtain a laminated body containing a second element. The laminated body containing the second element is provided on top of the laminated body containing the first element.

An auxiliary conductive pattern comprises the same material as the second conductive pattern, and is formed on the top face of the connection between the first conductive pattern and the second conductive pattern in the laminated body containing the first element. Conductors comprising the same material as the second conductive patterns are provided in through-holes in the insulating sheets and connect the first and second conductive patterns. The conductors comprising the same material as the second conductive pattern are clasped on either side by the second conductive pattern and the auxiliary conductive pattern comprising the same material as second conductive pattern.

Preferred embodiments of the laminated chip component of this invention will be explained with reference to FIGS. 1 to 6.

Figure 1:
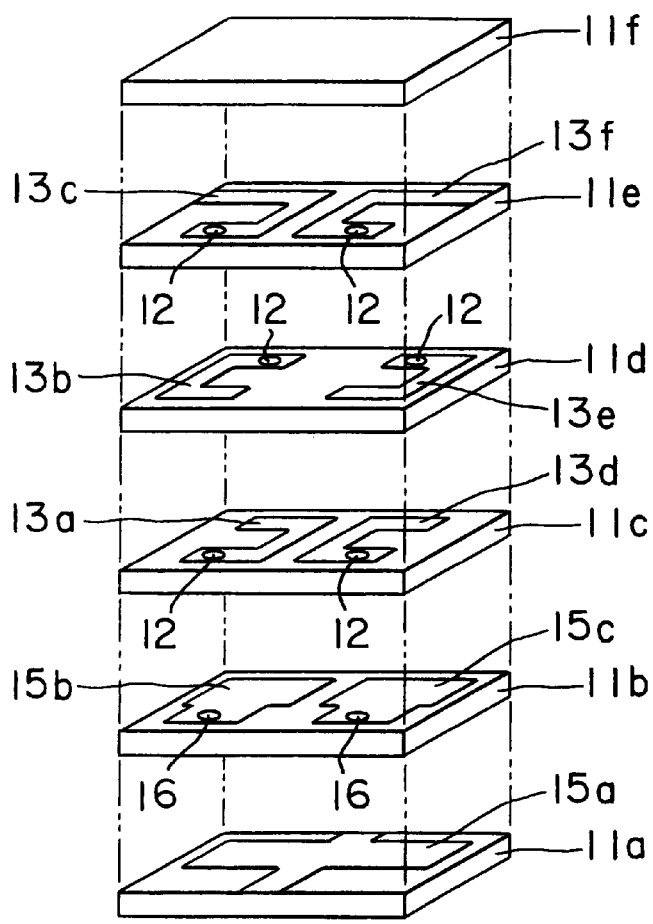
FIG. 1 is an exploded perspective view of a first embodiment of the laminated chip component of this invention.
Figure 2:
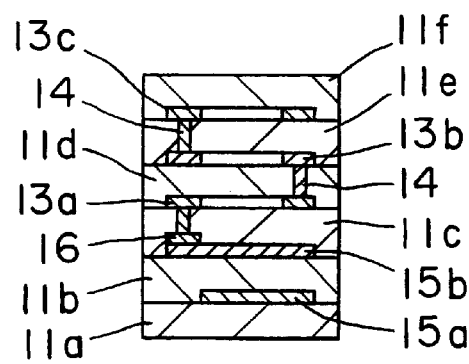
FIG. 2 is a cross-sectional view of FIG. 1.

FIG. 1 is an exploded perspective view of a first embodiment of the laminated chip component of this invention, and FIG. 2 is a cross-sectional view of the same.

In FIGS. 1 and 2, reference numerals 11a, 11b, 11c, 11d, 11e and 11f represent insulating sheets, reference numeral 12 represents a through-hole, reference numerals 13a, 13b, 13c, 13d, 13e and 13f represent conductive patterns for coil, and reference numerals 15a, 15b and 15c represent conductive patterns for capacitor.

The insulating sheets 11a, 11b, 11c, 11d, 11e and 11f comprise a ceramic material such as a dielectric or a magnetic substance.

A conductive pattern for capacitor 15a is formed on the top face of the insulating sheet 11a. Conductive patterns for capacitor 15b and 15c are formed on the top face of the insulating sheet 11b. A conductive pattern for capacitors 15a, 15b and 15c each comprises an electrically conductive material, such as an alloy of silver and palladium, copper, nickel and the like. Auxiliary conductive patterns 16 are formed on the top face of the connection section which connects to the coil of the conductive patterns for capacitors 15b and 15c. The auxiliary conductive patterns 16 are approximately the some side or larger than the through-holes 12 in the insulating sheet 11c. The electrically conductive material used to form the auxiliary conductive patterns 16 is the same as that used for the conductive patterns for coil explained later. A capacitor is formed between the conductive patterns for capacitor 15a and 15b which are provided on opposite sides of the insulating sheet 11b. A capacitor is also formed between the conductive patterns for capacitor 15a and 15c which are provided on opposite sides of is the insulating sheet 11b.

The conductive patterns for half-turn coil are formed on the top faces of each of the insulating sheets 11c, 11d and 11e. The conductive patterns for half-turn coil 13a, 13h, 13c, 13d, 13e and 13f each comprise an electrically conductive material such as silver or copper. The electrically conductive material comprising the conductive patterns for coil 13a, 13b, 13c, 13d, 13e and 13f is different from the electrically conductive material comprising the conductive patterns for capacitor. The conductive patterns for coil 13a, 13b and 13c are connected by conductors 14 which are provided in the through-holes 12, thereby forming a coil. Similarly, the conductive patterns for coil 13d, 13e and 13f are connected by conductors 14 which are provided in the through-holes 12, thereby forming a coil.

The conductive pattern for coil 13a which comprises this coil is connected to the auxiliary conductive pattern 16 on the conductive pattern for capacitor 15b by the conductor 14 provided in the through-hole 12 in the insulating sheet 11c. The conductive pattern for coil 13d which comprises this coil is connected to the auxiliary conductive pattern 16 on the conductive pattern for capacitor 15c by the conductor 14 provided in the through-hole 12 in the insulating sheet 11c. The material of the conductors 14 which connect the conductive patterns is the same as that used for the conductive patterns for coil.

The conductive pattern for coil 13c and the conductive pattern for coil 13f are extracted at both ends of the laminated body and connected to terminals. The conductive pattern for capacitor 15a is extracted at the sides of the laminated body where the conductive patterns for coil are not extracted, and is connected to terminals. The insulating sheet 11f protects the conductive patterns for coil 13c and 13f which are formed on the insulating sheet 11e.

Figure 3A:
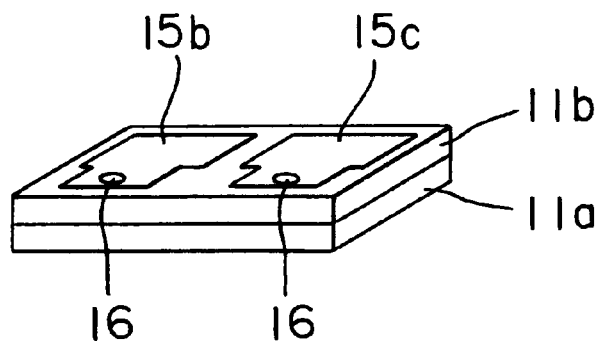
FIGS. 3A and 3B are diagrams showing a manufacturing sequence in the first embodiment of the laminated chip component of this invention.

The above laminated chip component is manufactured in the following way. Firstly, the conductive patterns for capacitor 15b and 15c are printed on the top face of the insulating sheet 11b. The auxiliary conductive patterns 16 are printed on the top face of the connection section which connect to the coil of the conductive patterns for capacitor 15b and 15c. As shown in FIG. 3A, the insulating sheet 11b is laminated on the top of the insulating sheet 11a which the conductive pattern for capacitor is printed on. Alternatively, this process may be performed in the following sequence. After the insulating sheet 11b has been laminated on the top of the insulating sheet 11a which the conductive pattern for capacitor is printed on, the conductive patterns for capacitor 15b and 15a are printed on the top face of the insulating sheet 11b. Subsequently, the auxiliary conductive patterns 16 are printed on the top face of the connection section which connects to the coil of the conductive patterns for capacitor 15b and 15c.

Figure 3B:
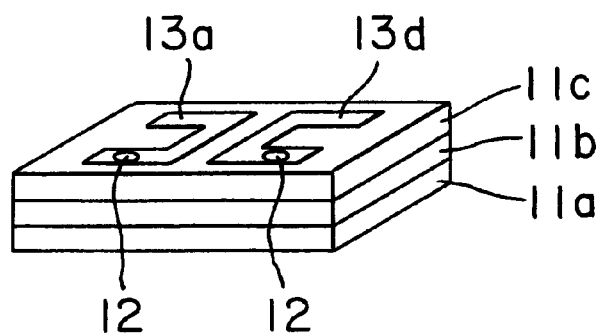

As shown in FIG. 3B, the insulating sheet 11c is laminated on the top of the insulating sheet 11b. The conductive patterns for coil 13a and 13d are connected to the auxiliary conductive patterns 16 on the conductive patterns for capacitor 15b and 15c by conductors which comprise the same material as the conductive patterns for coil provided in the through-holes 12 of the insulating sheet 11c. The conductive patterns for coil 13a and 13d may be printed beforehand on the top face of the insulating sheet 11c prior to laminating the insulating sheet 11c onto the insulating sheet 11b. Alternatively, they may be printed on the top face of the insulating sheet 11c after the insulating sheet 11c has been laminated onto the insulating sheet 11b.

The insulating sheets 11d and 11e are sequentially laminated on the insulating sheet 11c, thereby forming the coil.

Figure 4:
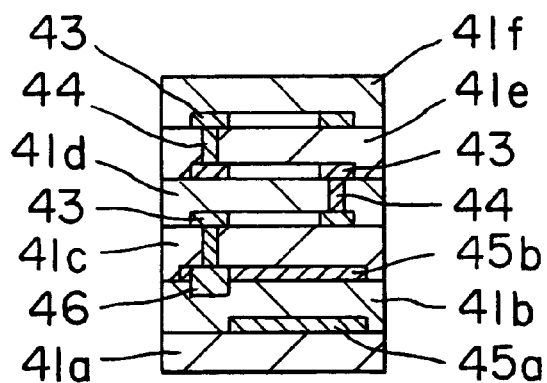
FIG. 4 is a cross-sectional view of a second embodiment of the laminated chip component of this invention.
Figure 7:
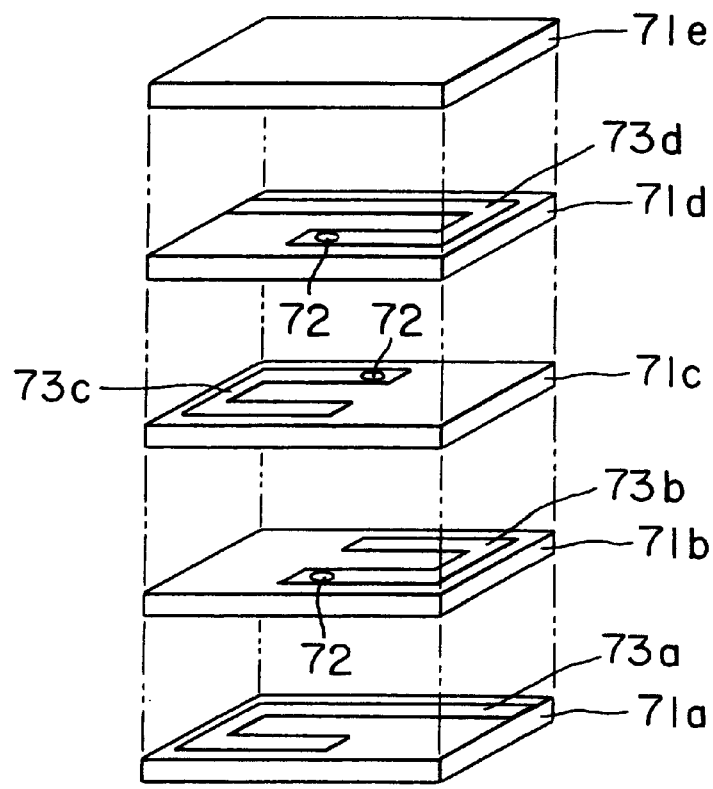
FIG. 7 is an exploded perspective view of a conventional laminated chip component.
Figure 8:
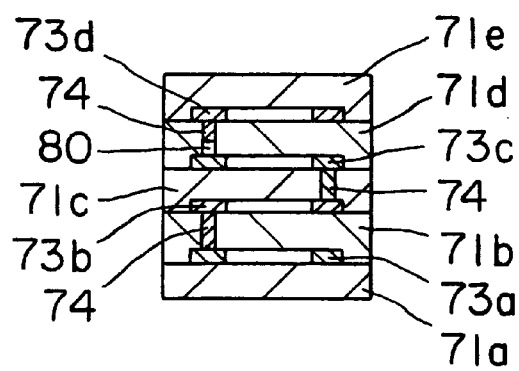
FIG. 8 is a cross-sectional view of FIG. 7.
Figure 9:
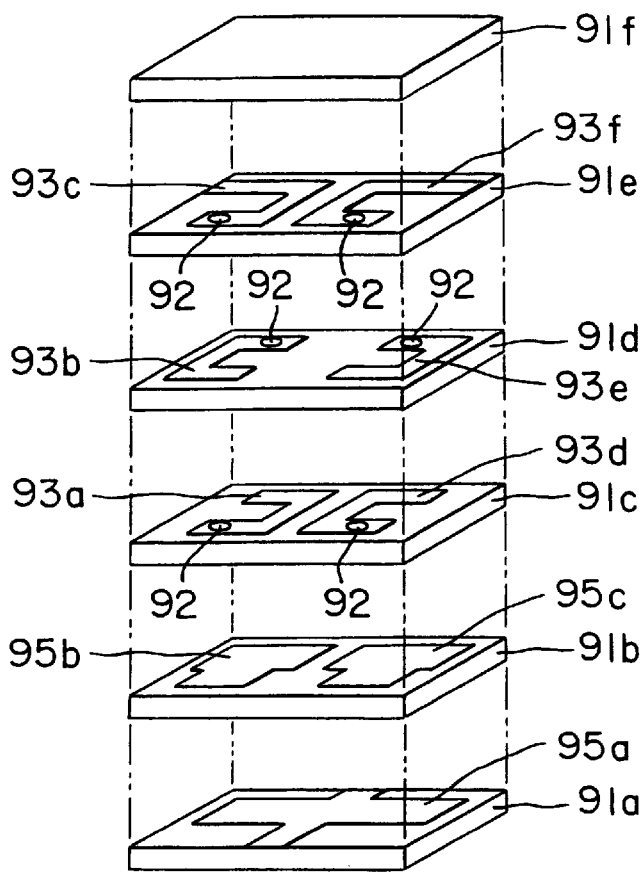
FIG. 9 is an exploded perspective view of another conventional laminated chip component.
Figure 10:
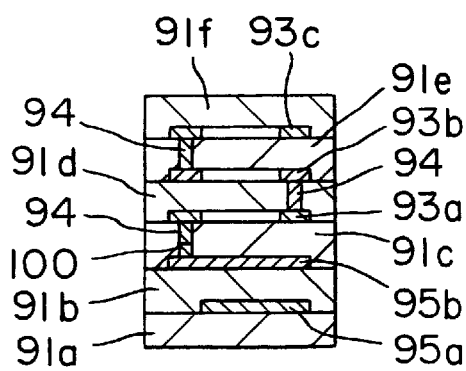
FIG. 10 is a cross-sectional view of FIG. 9.

FIG. 4 is a cross-sectional view of a second embodiment of the laminated chip component of this invention.

A conductive pattern for capacitor 45a is formed on the top face of an insulating sheet 41a. Conductive patterns for capacitor 45b and 45c are formed on the top face of an insulating sheet 41b. A conductive pattern for capacitor 45a, 45b and 45c comprises an electrically conductive material, such as an alloy of silver and palladium, copper, nickel and the like. Conductor sections are formed by providing cavities at a position which corresponding to the connection between the conductive pattern for capacitor 45b, 45c and the conductive patterns for coil (explained later) in insulating sheet 41b. The conductor sections are formed approximately the same size or larger than through-holes 42 in the insulating sheet 41c, and are provided conductors which comprise the same material as the conductive pattern for coil (explained later), at the positions which will connect with the conductive pattern for coil.

A capacitor is formed between the conductive patterns for capacitor 45a and 45b which are provided on the opposite sides of the insulating sheet 41b. A capacitor is also formed between the conductive patterns for capacitor 45a and 45c which are provided on the opposite sides or the insulating sheet 41b.

Two conductive patterns for half-turn coil 43 are formed on the top faces of each of the insulating sheets 41c, 41d and 41e. Each of the conductive patterns for half-turn coil 43 comprises an electrically conductive material such as silver or copper. The upper layer conductive pattern for coil and the lower layer conductive pattern for coil are connected by conductors 44 provided in through-holes, thereby forming two coils within the laminated body. The electrically conductive material comprising the conductive patterns for coil 43 is different from the electrically conductive material comprising the conductive patterns for capacitor.

The conductive patterns for coil which comprise this coil are connected to the conductive pattern for capacitor which comprises this capacitor by the conductor 44 provided in the through-hole of the insulating sheet 41c and the conductor 46 provided in the conductor section of the insulating sheet 41b. The material of the conductors 44 and 46 is the same as that used for the conductive patterns for coil. An insulating sheet 41f protects the conductive pattern coil formed on the insulating sheet 41e.

In the laminated chip component configured in the manner described above, conductor sections comprise cavities provided in the conductive patterns for capacitor on the insulating sheet 41b at the connections with the conductive patterns for coil, and conductors comprising the same material as the conductive patterns for coil are provided in the conductor sections. Therefore, more stocks of electrically conductive material can be used to connect the conductive patterns for coil and the conductive patterns for capacitor than in the first embodiment.

The above laminated chip component is manufactured in the following way. As shown in FIG. 5A, conductor sections 47 for providing conductors comprising the same material as the conductive pattern for coil are formed by providing cavities at positions corresponding to the connection between the conductive pattern for capacitor and the conductive pattern for coil in the insulating sheet 41b.

As shown in FIG. 5B, the conductive patterns for capacitor 45b and 45c are printed on the top face of the insulating sheet 41b. Conductors 46 comprise the same material as the conductive pattern for coil, and are provided in the conductor sections 47. The insulating sheet 41b is laminated on top of the insulating sheet 41a which the conductive pattern for capacitor is printed on. Alternatively, these processes may be performed in the following sequence. After the insulating sheet 41b has been laminated on top of the insulating sheet 41a, the conductive patterns for capacitor 45b and 45c are printed on the top face of the insulating sheet 41b, and the conductor 46 comprising the same material am the conductive pattern for coil is provided in the conductor section.

Moreover, as shown in FIG. 5C, the insulating sheet 41c is laminated on the insulating sheet 41b, and the conductive pattern for coil 43 is connected to the conductive patterns for capacitor 45b and 45c by the conductor which comprises the same material as the conductive pattern for coil and is provided in the through-hole in the insulating sheet 41c. The coil is formed by sequentially laminating the insulating sheets 41d and 41e on the insulating sheet 41c FIG. 6 is a cross-sectional view of a third embodiment of the laminated chip component of this invention.

Conductive patterns for capacitor 65 comprise an electrically conductive material, such as an alloy of silver and palladium, copper, nickel and the like, and are provided on the top faces of insulating sheet 61a and 61b. A conductor section is formed by providing a through-hole at the position which corresponding to the connection between the conductive pattern for capacitor and the conductive pattern for coil in the insulating sheet 61b. The conductor section is formed approximately the same size or larger than a through-hole 62 in the insulating sheet 61c, and is provided with a conductor comprising the same material as the conductive pattern for coil (explained later).

Conductive patterns 63 for half-turn coil comprise a conductive material such as silver or copper. Two conductive patterns 63 for half-turn coil are provided on the top face of each of insulating sheets 61c, 61d and 61e. Conductors 64 are provided in through-holes, and connect the upper layer conductive pattern for coil to the lower layer conductive pattern for coil. These conductive patterns for coil form two coils in the laminated body. The conductive material of the conductive patterns for coil is a different material to that of the conductive pattern for capacitor.

The conductive patterns for coil which form this coil are connected to the conductive pattern for capacitor which forms this capacitor by the conductor 64 provided in the through-hole of the insulating sheet 61c and the conductor 66 provided in the conductor section of the insulating sheet 61b. The conductors 64 and 66 comprise the same material as the conductive patterns for coil.

The laminated chip component of this invention configured as above, a conductor section comprising a through-hole is provided at the connection of the conductive pattern for capacitor of the insulating sheet 61b to the conductive pattern for coil, and a conductor comprising the same material as the conductive pattern for coil is provided in the through-hole. Therefore, the conductive material for connecting the conductive pattern for coil to the conductive pattern for capacitor can be stocked more fully than in any of the preceding embodiments.

The present invention is not limited to the embodiments described above. For example, the auxiliary conductive pattern may be provided on the top face facing the through-holes of the conductive pattern for coil. The auxiliary conductive pattern which faces the through-hole of the conductive pattern can be one of many types of shape such as circular, square, many-sided, etc. Moreover, a laminated body containing a capacitor may be laminated on a laminated body containing a coil. Alternatively, laminated bodies containing capacitors may be laminated on both sides of a laminated body containing a coil.

In the second and third embodiments, an additional auxiliary conductor pattern comprising the same material as the conductive pattern for coil may be formed on the top faces of the conductors which are provided in the conductor sections and the conductive patterns for capacitor.

The above description of the embodiments referred to a circuit comprising coils and capacitors laminated together, but the laminated chip component of this invention may be applied in an inductance element.

As described above, according to the laminated chip component of this invention, auxiliary conductive patterns which are provided on the top faces of the conductive patterns at positions facing the through-holes of adjacent insulating sheets. Therefore, an electrically conductive material can be supplied from the auxiliary conductive patterns provided on the top faces of the conductive patterns to the conductors in the through-holes, even when the conductive pattern and the conductors provided in the through-holes shrink more than the insulating sheets. As a consequence, breaks in the connections in the through-holes of the insulating sheets can be prevented in the laminated chip component of this invention even when the firing shrinkage rate of the conductive patterns is greater than that of the insulating sheets.

Further, according to the laminated chip component of this invention, an auxiliary conductive pattern comprises the same material as the second conductive pattern, and is provided on the top face of the connection section which connect to the second conductive pattern of the first conductive pattern. Therefore, an electrically conductive material can be supplied from the auxiliary conductive pattern, which comprises the same material as the second conductive pattern and is provided on the top face of the first conductive pattern, to the conductors comprising the same material as the second conductive pattern which are provided in the through-holes. As a consequence, breaks in the connections in the through-holes of the insulating sheets can be prevented in the laminated chip component of this invention even in the case where the firing shrinkage rate of the conductive patterns is greater than that of the insulating sheets, and the case where the firing shrinkage rates and reactivity or the two types of conductive pattern are different.

What is claimed is:

1. A laminated chip component comprising:
    a laminated body which is configured by alternately laminating conductive patterns and insulating sheets;
    through-holes formed in said insulating sheets; and
    conductor portions, which are configured via holes, formed so as not to contact with conductive patterns positioned at layers lowers than said insulating sheets;
    wherein, a first conductive pattern formed on said insulating sheet and a second conductive pattern positioned at upper layers higher than said first conductive pattern are connected by a conductor formed in said through-holes or said conductor portion.

2. The laminated chip component as claimed in claim 1, further comprising an auxiliary conductive pattern provided on said first conductive pattern on said insulating sheet having said conductor portion at a connecting portion connecting said second conductive pattern and said first conductive pattern.

3. A laminated chip component comprising:
    a laminated body which is configured by alternately laminating conductive patterns and insulating sheets;
    through-hole formed in said insulating sheets;
    a conductor portion which is configured in a cavity formed in said insulating sheets so as not to contact with conductive patterns positioned at layers lowers than said insulating sheets;
    an auxiliary conductive pattern provided on said conductive pattern on said insulating sheet having said conductor portion at a connecting portion connecting a first conductive pattern formed on said insulating sheet and a second conductive pattern positioned at upper layers higher than said first conductive pattern;

wherein, said first conductive pattern and said second conductive pattern are connected by a conductor formed in said through-holes or said conductive pattern.

4. A laminated chip component comprising:

a laminated body which is configured by alternately laminating conductive patterns and insulating sheets; and through-holes formed in said insulating sheets;

said conductive patterns comprising a first conductive pattern and a second conductive pattern, said first and second conductive patterns being made of different materials respectively;

an auxiliary conductive pattern being made of the same material as said second conductive pattern and being provided on the surface of said first conductive pattern; and wherein said first conductive pattern and said second conductive pattern being connected to each other by filling said through-holes, extending between said second conductive pattern and said auxiliary conductive pattern, with the same material as that of said second conductive pattern.

5. A laminated chip component comprising:

a laminated body which is configured by alternately laminating conductive patterns and insulating sheets; and through-holes formed in said insulating sheets;

said conductive pattern comprising a first conductive pattern and a second conductive pattern of different materials;

a cavity being provided on said insulating sheet on which said first conductive pattern is provided so as to provide a conductor portion on said insulating sheet, said first and second conductive patterns being connected by filling the through-holes, extending between said first and second conductive patterns and said conductor portion, with the same material as said second conductive pattern.

6. The laminated chip component as claimed in claim 5, further comprising an auxiliary conductive pattern provided on said first conductive pattern on said insulating sheet having said conductor portion at a connecting portion connecting said second conductive pattern and said first conductive pattern.

7. A laminated chip component comprising:

a laminated body which is configured by alternately laminating conductive patterns and insulating sheets; and through-holes formed in said insulating sheets;

said conductive pattern comprising a first conductive pattern and a second conductive pattern of different materials;

a via hole being provided on said insulating sheets on which said first conductive pattern is provided so as not to contact with conductive patterns positioned lower than said insulating sheets, thus providing conductor portions on said insulating sheet;

said first and second conductive patterns being connected by filling said through-holes, extending between said first and second conductive patterns and said conductor portions, with a conductive material.

8. The laminated chip component as claimed in claim 7, further comprising an auxiliary conductive pattern provided on said first conductive pattern on said insulating sheet having said conductor portion, said auxiliary conductive pattern being provided at the connecting portion to said second conductive portion at a connecting portion connecting said second conductive pattern and said first conductive pattern.

* * * * *